(12) United States Patent
Fang

(10) Patent No.: US 7,928,634 B2
(45) Date of Patent: Apr. 19, 2011

(54) SYSTEM AND METHOD FOR PROVIDING A PIEZOELECTRIC ELECTROMAGNETIC HYBRID VIBRATING ENERGY HARVESTER

(75) Inventor: Hua Bin Fang, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 452 days.

(21) Appl. No.: 12/107,422

(22) Filed: Apr. 22, 2008

(65) Prior Publication Data

US 2009/0261689 A1 Oct. 22, 2009

(51) Int. Cl.
*H01L 41/08* (2006.01)

(52) U.S. Cl. ..................................... 310/339

(58) Field of Classification Search ............... 310/339, 310/30–332, 334; 290/1 R; *H01L 41/113*
See application file for complete search history.

(56) References Cited

U.S. PATENT DOCUMENTS

| | | | |
|---|---|---|---|
| 3,900,830 A | 8/1975 | Peterson | |
| 4,387,318 A | 6/1983 | Kolm et al. | |
| 6,971,258 B2 | 12/2005 | Rhodes et al. | |
| 7,112,892 B2 | 9/2006 | Mahowald | |
| 7,155,334 B1 | 12/2006 | Stewart et al. | |
| 7,275,415 B2 | 10/2007 | Rhodes et al. | |
| 7,579,757 B2 * | 8/2009 | Kulah et al. | 310/339 |
| 7,692,365 B2 * | 4/2010 | Churchill et al. | 310/339 |
| 2005/0140212 A1 | 6/2005 | Hamel et al. | |
| 2006/0016246 A1 | 1/2006 | Rhodes et al. | |
| 2006/0059152 A1 | 3/2006 | Nakamura | |
| 2006/0137346 A1 | 6/2006 | Stewart et al. | |
| 2007/0039589 A1 | 2/2007 | Stewart et al. | |
| 2007/0089399 A1 | 4/2007 | Rhodes et al. | |
| 2007/0125176 A1 | 6/2007 | Liu | |
| 2007/0137177 A1 | 6/2007 | Kittelson et al. | |
| 2007/0142999 A1 | 6/2007 | Baramov et al. | |
| 2007/0271903 A1 | 11/2007 | Rhodes et al. | |
| 2007/0284969 A1 | 12/2007 | Xu | |
| 2008/0264144 A1 | 10/2008 | Mao et al. | |
| 2008/0282682 A1 | 11/2008 | C. et al. | |
| 2009/0040674 A1 | 2/2009 | Roberts et al. | |

(Continued)

FOREIGN PATENT DOCUMENTS

EP 0 725 452 A1 8/1996

(Continued)

OTHER PUBLICATIONS

Shad Roundy, et al., "A study of low level vibrations as a power source for wireless sensor nodes", Computer Communications, vol. 26, 2003, p. 1131-1144.

(Continued)

*Primary Examiner* — Thomas M Dougherty
*Assistant Examiner* — Karen Addison
(74) *Attorney, Agent, or Firm* — Munck Carter, LLP

(57) ABSTRACT

A system and method are disclosed for providing a piezoelectric electromagnetic hybrid vibrating energy harvester. The invention comprises a piezoelectric vibrating energy harvesting device that harvests electrical energy from vibrations using a piezoelectric effect. The invention also comprises an electromagnetic vibrating energy harvesting device that simultaneously harvests electrical energy from the same vibrations using electromagnetic induction. A permanent magnet mass mounted on a cantilever host beam of the piezoelectric vibrating energy harvesting device provides a variable magnetic flux to a fixed conductive winding of the electromagnetic vibrating energy harvesting device when the permanent magnet mass vibrates.

20 Claims, 4 Drawing Sheets

U.S. PATENT DOCUMENTS

| | | |
|---|---|---|
| 2009/0188300 A1 | 7/2009 | Gualtieri et al. |
| 2009/0206803 A1 | 8/2009 | Gualtieri |
| 2010/0194240 A1* | 8/2010 | Churchill et al. ............ 310/339 |

FOREIGN PATENT DOCUMENTS

| | | |
|---|---|---|
| WO | WO 01/20760 A1 | 3/2001 |
| WO | WO 02/084754 A2 | 10/2002 |

OTHER PUBLICATIONS

P. Glynne-Jones, et al., "Towards a piezoelectric vibration-powered microgenerator", IEE Proc.-Sci. Meas. Technol., vol. 148, No. 2, Mar. 2001, p. 68-72.

Nathan S. Shenck, et al., "Energy Scavenging with Shoe-Mounted Piezoelectrics", 2001 IEEE, p. 30-42.

* cited by examiner

SYSTEM AND METHOD FOR PROVIDING A PIEZOELECTRIC ELECTROMAGNETIC HYBRID VIBRATING ENERGY HARVESTER

TECHNICAL FIELD OF THE INVENTION

The present invention is directed, in general, to electrical power harvesting systems and methods and, more specifically, to a system and method for providing a piezoelectric electromagnetic hybrid vibrating energy harvester.

BACKGROUND OF THE INVENTION

In electrical systems power conservation is always an important factor. In some electrical systems power conservation may even be a critical factor. Mobile electronic devices such as wireless cellular telephones usually operate on battery power. The battery must be periodically replaced or periodically recharged.

Some electrical system applications such as wireless sensor networks operate at low power and low data rates. Batteries that have a long life (e.g., up to ten years) are usually employed in such applications. In some applications replacing batteries (even long-lived batteries) is not practical. Replacement battery costs, labor costs, and hard-to-access locations may make the use of battery sources of power impractical in some cases. Therefore, systems and methods have been sought that extract (or harvest) electrical power from the environment.

Piezoelectric materials have been used to extract electrical power from the environment. It is well known that piezoelectric materials produce electric charges on portions of their surfaces when they are under mechanical stress. Either compressive stress or tensile stress on a piezoelectric material will cause electrical charges to be generated at the surface of the piezoelectric material.

A mechanical stress that is applied to a piezoelectric material will produce an electric polarization in the piezoelectric material that is proportional to the applied stress. The electric polarization manifests itself as a voltage across the piezoelectric material. It is well known that piezoelectric materials may be used in electromechanical transducers to convert mechanical energy to electrical energy.

In some embodiments a piezoelectric vibrating energy harvester comprises a cantilever structure that supports a piezoelectric film (e.g., a lead-zirconate-titanate (PZT) film). Ambient vibrations in the environment cause the cantilever and piezoelectric film to move back and forth (vibrate). The stress applied to the piezoelectric film causes the piezoelectric film to transform the energy in the ambient vibrations into electrical energy that can be accumulated and stored for later use. This type of piezoelectric power generation provides an alternative power source for operating low power very large scale integration (VLSI) electronic devices.

An example of such a micro-electromechanical vibrating energy harvester that is based on piezoelectric power generation principles is described in United States Patent Application Publication No. 2007/0125176 for a patent application by Yue Liu that was filed on Dec. 2, 2005 and published on Jun. 7, 2007.

FIG. 1 illustrates a prior art piezoelectric vibrating energy harvester 100. As shown in FIG. 1, the harvester 100 comprises a fixed end 110. A first end of a cantilever host beam 120 is fixed to the fixed end 110. The second end of the cantilever host beam 120 is not fixed to any structure and is free to move up and down (i.e., to vibrate) in a vertical direction.

A piezoelectric layer 130 is placed and positioned on top of the cantilever host beam 120 along the length of the cantilever host beam 120. A mass 140 (e.g., a block of metal 140) is placed on top of the piezoelectric layer 130. The mass 140 is preferably placed at the freely vibrating second end of the cantilever host beam 120.

The cantilever host beam 120 and the piezoelectric layer 130 vibrate in response to ambient vibrations that cause the mass 140 to move up and down. The piezoelectric layer 130 transforms the vibrations into electrical energy that appears as alternating current (AC) voltage (designated in FIG. 1 as $V_{OUT}$) across the piezoelectric layer 130. A first electrical connection 150 connects a first electrical output of the piezoelectric layer 130 to a first input of a rectifier circuit 160. A second electrical connection 170 connects a second electrical output of the piezoelectric layer 130 to a second input of the rectifier circuit 160.

The rectifier circuit 160 comprises four diode circuits that operate using well known principles to pass the voltage signal $V_{OUT}$ to a power storage unit 180. The voltage $V_{OUT}$ is passed through the first electrical connection 150 and the rectifier circuit 160 to the power storage unit 180. The voltage $V_{OUT}$ is passed through the second electrical connection 170 and the rectifier circuit 160 to the power storage unit 180. The voltage $V_{OUT}$ from the piezoelectric layer 130 is accumulated in the power storage unit 180. The voltage that is accumulated in the power storage unit 180 may subsequently be used to provide an alternative power source (designated Power Output in FIG. 1).

The prior art piezoelectric vibrating energy harvester 100 described above generally has an output performance that produces a high voltage and a low current. It would be desirable to have a vibrating energy harvester that could produce both a high voltage and a high current. It would also be desirable to have a vibrating energy harvester that could generate and store more electrical energy than a piezoelectric vibrating energy harvester can generate and store.

SUMMARY OF THE INVENTION

To address the above discussed deficiencies of the prior art, it is a primary object of the present invention to provide a system and method for providing a piezoelectric electromagnetic hybrid vibrating energy harvester.

The vibrating energy harvester of the present invention combines a piezoelectric cantilever host beam harvesting technique with an electromagnetic harvesting technique. A first end of a piezoelectric cantilever host beam is attached to a fixed end structure. A permanent magnet mass is attached to the free second end of the piezoelectric cantilever host beam. A circuit that comprises a fixed conductive winding is placed below the cantilever host beam and the permanent magnet mass.

When the harvester is stimulated by ambient vibrations, the relative movement between the cantilever host beam and its fixed end will induce stress-electricity conversion through the piezoelectric effect. Simultaneously, the permanent magnet mass will move together with the cantilever host beam. The relative movement of the permanent magnet mass with respect to the fixed conductive winding will induce electromotance in the conductive winding through Michael Faraday's law of electromagnetic induction. The piezoelectric electromagnetic hybrid vibrating energy harvester of the present invention enhances the efficiency of the vibration to electricity conversion.

Other technical features may be readily apparent to one skilled in the art from the following figures, descriptions, and claims.

BRIEF DESCRIPTION OF THE DRAWINGS

For a more complete understanding of the present invention, and the advantages thereof, reference is now made to the following descriptions taken in conjunction with the accompanying drawings, wherein like numbers designated like objects, and in which.

DETAILED DESCRIPTION

Figure 2:
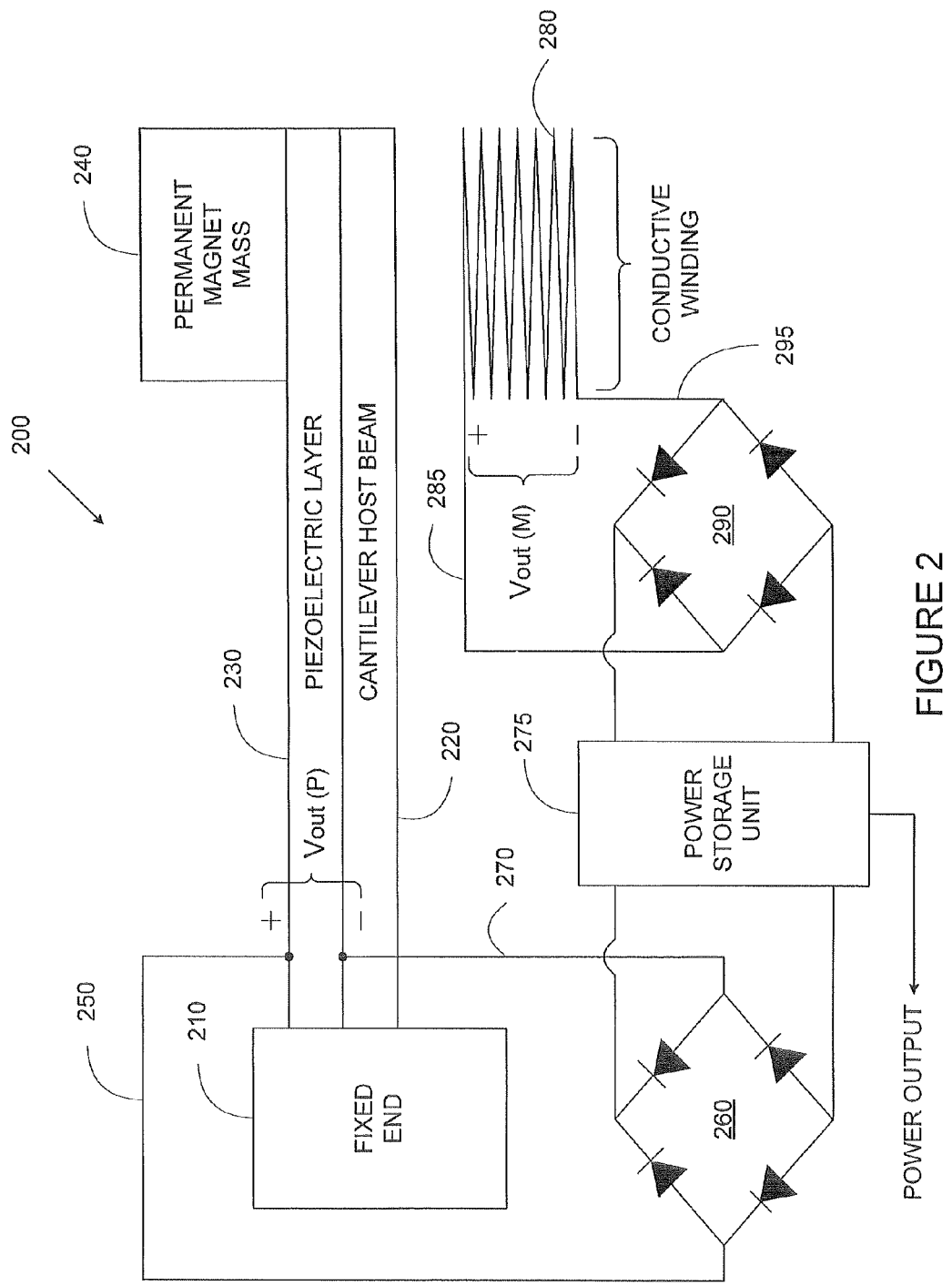
FIG. 2 illustrates schematic diagram of an advantageous embodiment of a piezoelectric electromagnetic hybrid vibrating energy harvester of the present invention.
Figure 3:
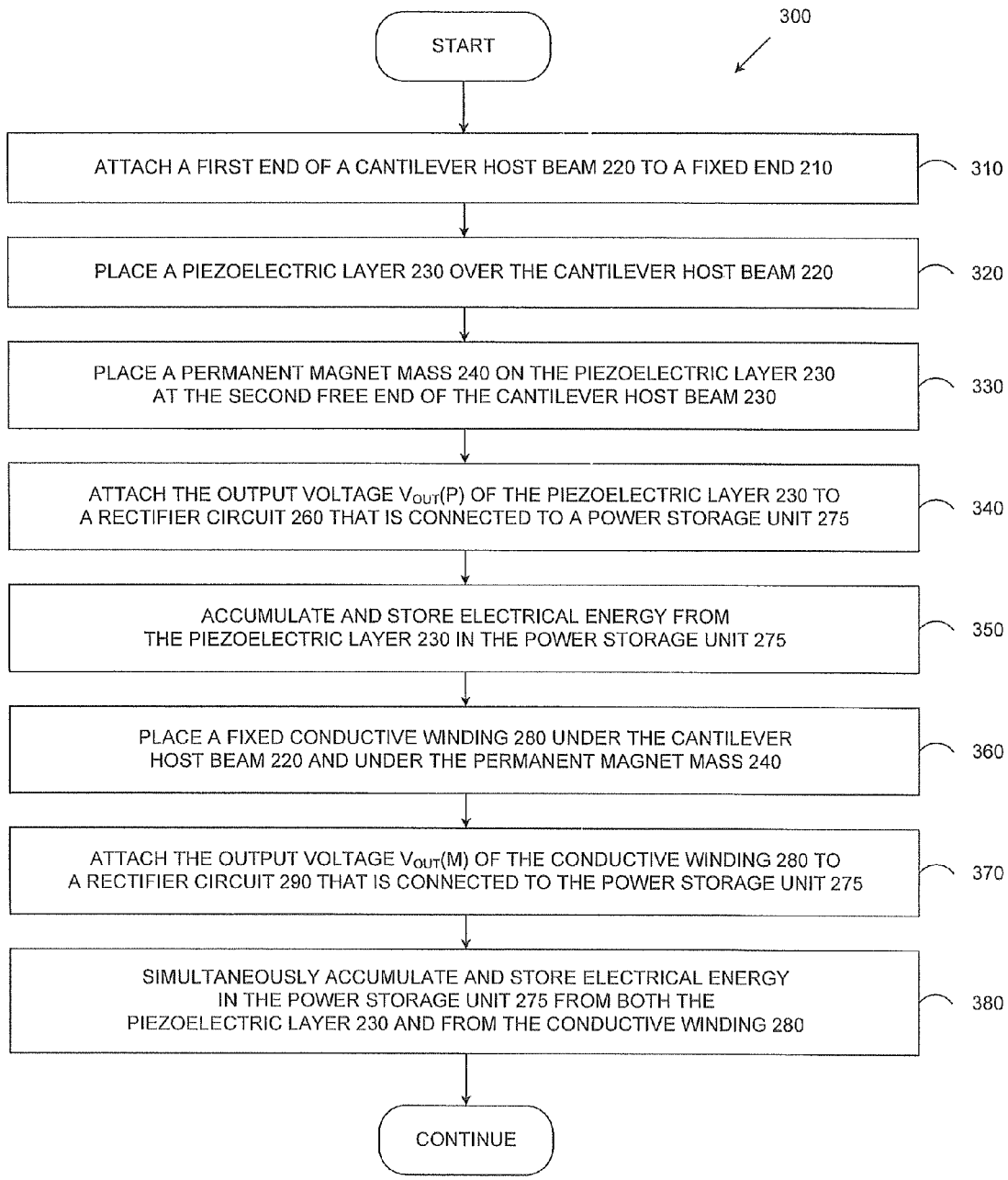
FIG. 3 illustrates a flow chart showing the steps of an advantageous embodiment of a method of the present invention.
Figure 4:
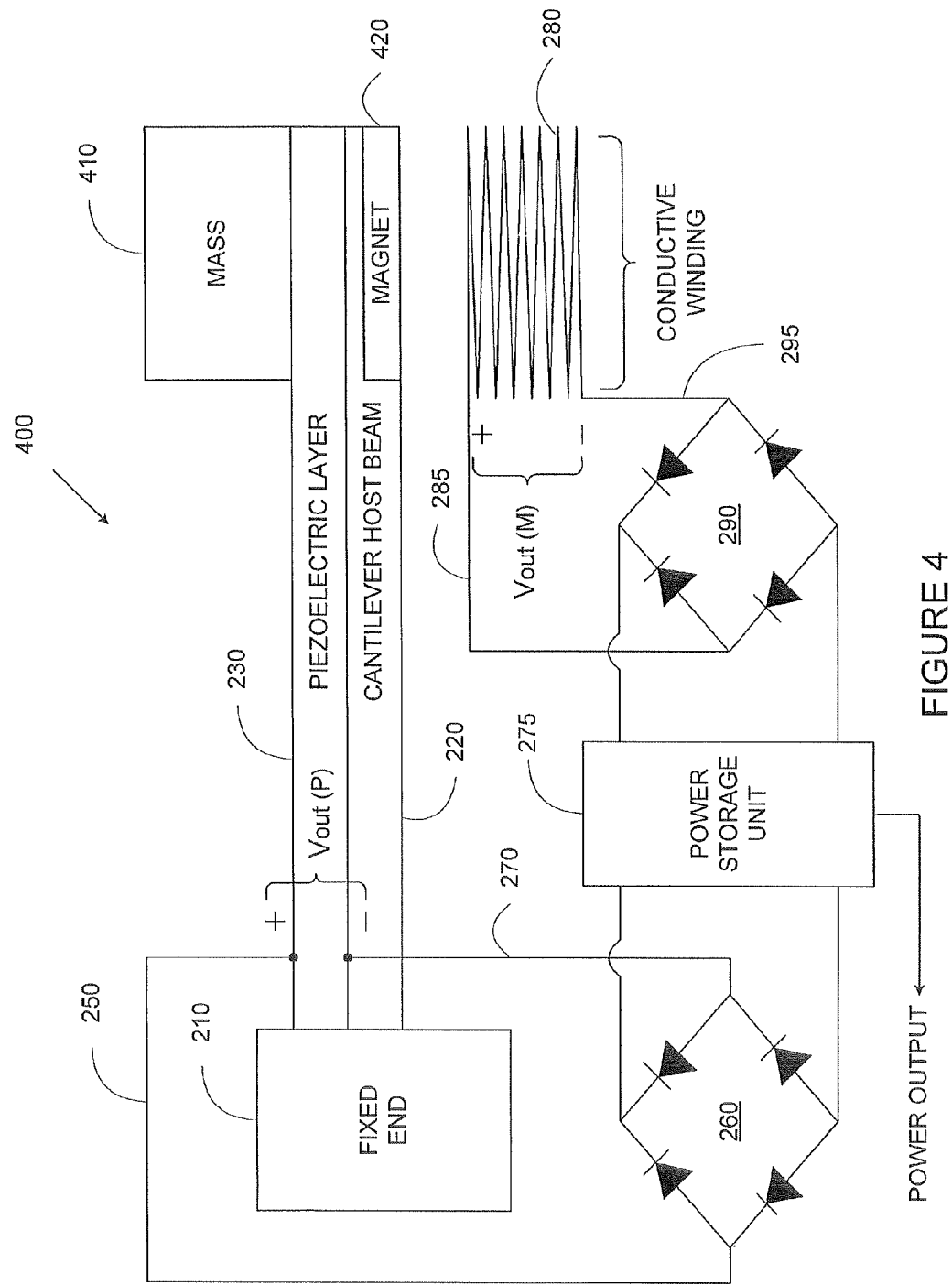
FIG. 4 illustrates schematic diagram of another advantageous embodiment of a piezoelectric electromagnetic hybrid vibrating energy harvester of the present invention.

FIGS. 2 through 4 and the various embodiments used to describe the principles of the present invention in this patent document are by way of illustration only and should not be construed in any way to limit the scope of the invention. Those skilled in the art will understand that the principles of the invention may be implemented in any type of suitably arranged vibrating energy harvester.

FIG. 2 illustrates schematic diagram of an advantageous embodiment of a piezoelectric electromagnetic hybrid vibrating energy harvester 200 of the present invention. The vibrating energy harvester 200 harvests electrical energy from ambient vibrations using both piezoelectric principles of operation and electromagnetic principles of operation. The vibrating energy harvester 200 of the present invention is a hybrid because it uses two different physical principles of operation at the same time to harvest electrical energy.

As shown in FIG. 2, the harvester 200 comprises a fixed end 210. A first end of a cantilever host beam 220 is fixed to the fixed end 210. The second end of the cantilever host beam 220 is not fixed to any structure and is free to move up and down (i.e., to vibrate) in a vertical direction.

A piezoelectric layer 230 is placed and positioned on top of the cantilever host beam 220 along the length of the cantilever host beam 220. A permanent magnet mass 240 (e.g., a block of permanently magnetized metal 240) is placed on top of the piezoelectric layer 230. The permanent magnet mass 240 is preferably placed at the freely vibrating second end of the cantilever host beam 220.

Figure 1:
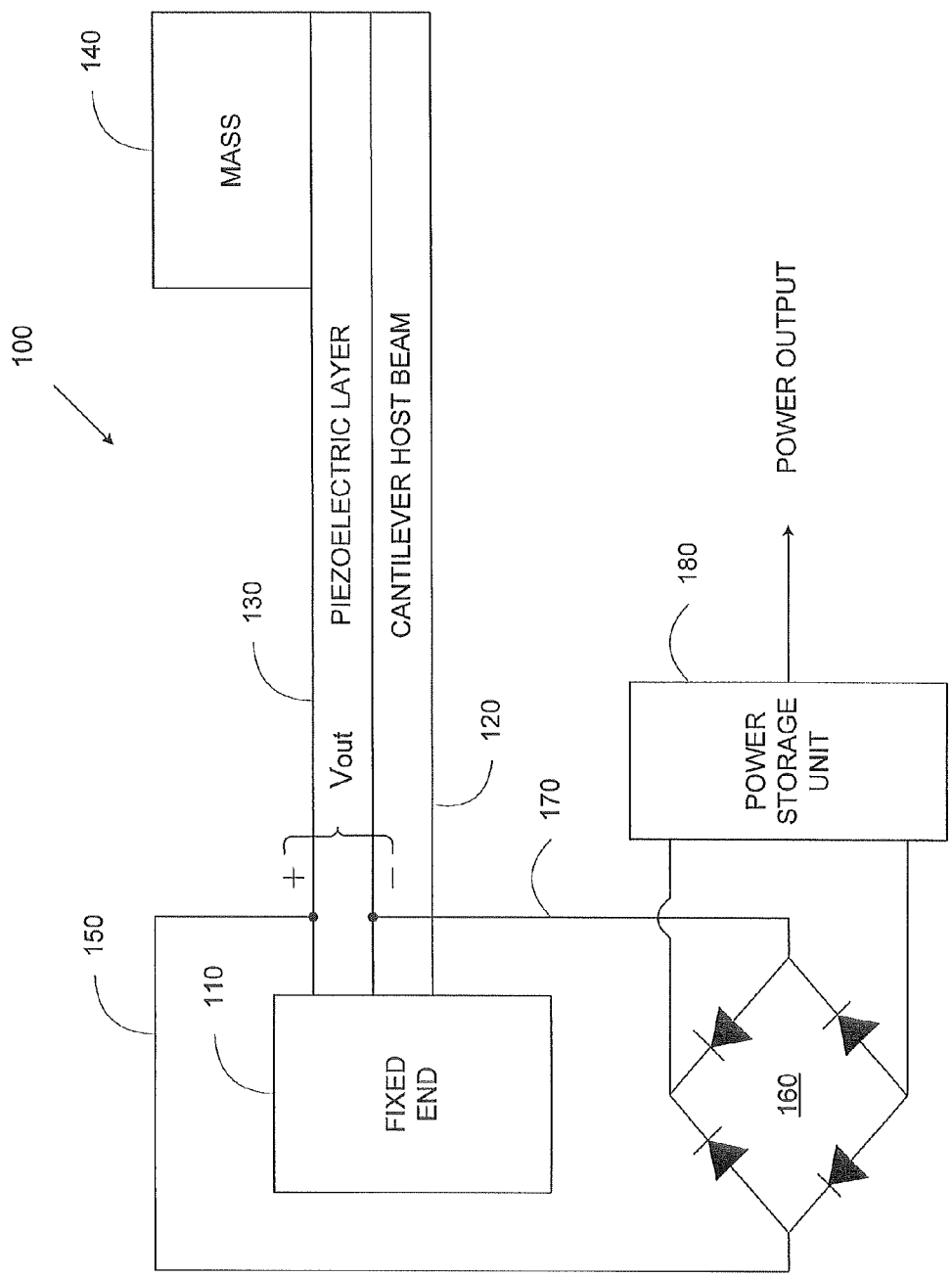
FIG. 1 illustrates a schematic diagram of a prior art piezoelectric vibrating energy harvester.

The cantilever host beam 220 and the piezoelectric layer 230 vibrate in response to ambient vibrations that cause the permanent magnet mass 240 to move up and down. The piezoelectric layer 230 transforms the vibrations into electrical energy that appears as an alternating current (AC) voltage (designated in FIG. 1 as $V_{OUT}(P)$) across the piezoelectric layer 230. The letter P signifies that the voltage $V_{OUT}(P)$ is derived from a piezoelectric source. A first electrical connection 250 connects a first electrical output of the piezoelectric layer 230 to a first input of a rectifier circuit 260. A second electrical connection 270 connects a second electrical output of the piezoelectric layer 230 to a second input of the rectifier circuit 260.

The rectifier circuit 260 comprises four diode circuits that operate using well known principles to pass the voltage signal $V_{OUT}(P)$ to a power storage unit 275. The voltage $V_{OUT}(P)$ is passed through the first electrical connection 250 and the rectifier circuit 260 to the power storage unit 275. The voltage $V_{OUT}(P)$ is passed through the second electrical connection 270 and the rectifier circuit 260 to the power storage unit 275. The voltage $V_{OUT}(P)$ from the piezoelectric layer 230 is accumulated in the power storage unit 275. The voltage that is accumulated in the power storage unit 275 may subsequently be used to provide an alternative power source (designated Power Output in FIG. 2).

As shown in FIG. 2, the harvester 200 also comprises a second circuit portion that comprises a conductive winding 280. In one advantageous embodiment of the harvester 200 of the invention, the conductive winding 280 comprises a plurality of loops of conductive wire. In the advantageous embodiment of the harvester 200 that is shown in FIG. 2, the conductive winding 280 is located under the second free end of the cantilever host beam 220 and under the permanent magnet mass 240.

As ambient vibrations cause the end of the cantilever host beam 220 and the permanent magnet mass 240 to vibrate (i.e., to move up and down), the motion of the permanent magnet mass 240 with respect to the conductive winding 280 causes an induced alternating current (AC) voltage (designated $V_{OUT}(M)$ in FIG. 2) to appear across the conductive winding 280. The induced voltage $V_{OUT}(M)$ is due to transformer induced electromotance that occurs due to Michael Faraday's law of electromagnetic inductance. It is well known that transformer induced electromotance occurs when a fixed circuit (here, the conductive winding 280) is linked by a variable magnetic flux (here, the variable magnetic flux due to the back and forth motion of the permanent magnet mass 240).

Motion of the permanent magnet mass 240 towards the conductive winding 290 causes the voltage $V_{OUT}(M)$ to be induced in a first direction. Motion of the permanent magnet mass 240 away from the conductive winding 280 causes the voltage $V_{OUT}(M)$ to be induced in a second opposite direction.

A third electrical connection 285 connects a first end of the conductive winding 280 to a first input of a rectifier circuit 290. A fourth electrical connection 295 connects a second end of the conductive winding 280 to a second input of the rectifier circuit 290.

The rectifier circuit 295 comprises four diode circuits that operate using well known principles to pass the voltage signal $V_{OUT}(M)$ to the power storage unit 275. The voltage $V_{OUT}(M)$ is passed through the third electrical connection 285 and the rectifier circuit 290 to the power storage unit 275. The voltage $V_{OUT}(M)$ is passed through the fourth electrical connection 295 and the rectifier circuit 290 to the power storage unit 275. The voltage $V_{OUT}(M)$ from the conductive winding 280 is accumulated in the power storage unit 275. The voltage that is accumulated in the power storage unit 275 may subsequently be used to provide an alternative power source (designated Power Output in FIG. 2).

In this manner, the vibrating energy harvester 200 simultaneously harvests electrical energy (in the form of voltage $V_{OUT}(P)$) from the piezoelectric layer 230 and harvests electrical energy (in the form of voltage $V_{OUT}(M)$) from the conductive winding 280. This means that the electrical energy harvester 200 is a piezoelectric electromagnetic hybrid vibrating energy harvester. The piezoelectric electromagnetic hybrid vibrating energy harvester 200 of the present invention is capable of generating and storing more electrical energy than a prior art harvester that harvests only piezoelectric vibrating energy.

A prior art piezoelectric vibrating energy harvester generally has an output performance that produces a high voltage and a low current. An electromagnetic vibrating energy harvester generally has an output performance that produces a low voltage and a high current. By simultaneously using both a piezoelectric energy harvester and an electromagnetic energy harvester, the hybrid vibrating energy harvester 200 of the present invention provides an apparatus that can provide an output performance that has both a high voltage and a high current. The permanent magnet mass 240 is utilized to decrease the device natural frequency to meet resonant operation in general low frequency ambient vibrations.

FIG. 3 illustrates a flow chart 300 showing the steps of an advantageous embodiment of a method of the present invention. In the first step of the method shown in flow chart 300 a first end of a cantilever host beam 220 is attached to a fixed end 210 (step 310). Then a piezoelectric layer 230 is placed over the cantilever host beam 220 (step 320). Then a permanent magnet mass 230 is placed on the piezoelectric layer 230 at the second free end of the cantilever host beam 230 (step 330).

Then the output voltage $V_{OUT}(P)$ of the piezoelectric layer 230 is attached to a rectifier circuit 260 which is attached to a power storage unit 275 (step 340). The electrical energy from the piezoelectric layer 230 is accumulated and stored in the power storage unit 275 (step 350).

Then a fixed conductive winding 280 is placed under the cantilever host beam 220 and under the permanent magnet mass 240 (step 360). Then the output voltage $V_{OUT}(M)$ of the conductive winding 280 is attached to a rectifier circuit 290 which is attached to the power storage unit 275 (step 370). The electrical energy from both the piezoelectric layer 230 and the conductive winding 280 is simultaneously accumulated and stored in the power storage unit 275 (step 380).

The advantageous embodiment of the vibrating energy harvester 200 of the present invention that is shown in FIG. 2 comprises a piezoelectric layer 230 that is located on top of a cantilever host beam 230. In an alternate advantageous embodiment of the vibrating energy harvester 200 the piezoelectric layer can be located on the bottom of the cantilever host beam.

The advantageous embodiment of the vibrating energy harvester 200 of the present invention that is shown in FIG. 2 comprises a permanent magnet mass 240 that is located on top of a piezoelectric layer 230 on top of the cantilever host beam 230. In an alternate advantageous embodiment of the vibrating energy harvester 200 the permanent magnet mass 240 can be located on the bottom of the cantilever host beam 220 so that the permanent magnet mass 240 is closer to the conductive winding 280. Placing the permanent magnet mass 240 closer to the conductive winding 280 increases the strength of the variable magnetic flux through the conductive winding 280.

The advantageous embodiment of the vibrating energy harvester 200 of the present invention that is shown in FIG. 2 comprises a conductive winding 280 that is located under a cantilever host beam 230. In an alternate advantageous embodiment of the vibrating energy harvester 200 the conductive winding 280 can be located above the cantilever structure. The conductive winding 280 can be located above the permanent magnet mass 240 that is located on the top of the piezoelectric layer 230 on the cantilever host beam 220. Placing the conductive winding 280 closer to the permanent magnet mass 240 increases the strength of the variable magnetic flux through the conductive winding 280.

FIG. 4 illustrates schematic diagram of another advantageous embodiment of a piezoelectric electromagnetic hybrid vibrating energy harvester 400 of the present invention. The vibrating energy harvester 400 is the same as the vibrating energy harvester 200 except for the items mentioned below. A non-magnetic mass 410 is used in place of the permanent magnet mass 240 and a permanent magnet 420 is attached to the bottom of the cantilever host beam 220. This embodiment of the invention places the permanent magnet 420 (and its magnetic flux) closer to the conductive winding 420. This arrangement increases the strength of the variable magnetic flux through the conductive winding 280.

It may be advantageous to set forth definitions of certain words and phrases used throughout this patent document. The terms "application," "program," and "routine" refer to one or more computer programs, sets of instructions, procedures, functions, objects, classes, instances, or related data adapted for implementation in a suitable computer language. The term "couple" and its derivatives refer to any direct or indirect communication between two or more elements, whether or not those elements are in physical contact with one another.

The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of the invention, as defined by the following claims.

What is claimed is:

1. An apparatus that comprises a piezoelectric electromagnetic hybrid vibrating energy harvester, the piezoelectric electromagnetic hybrid vibrating energy harvester comprising:
   a piezoelectric vibrating energy harvesting device that comprises a permanent magnet mass; and
   an electromagnetic vibrating energy harvesting device configured to receive a variable magnetic flux from the permanent magnet mass when the permanent magnet mass moves.

2. The apparatus as claimed in claim 1, wherein the apparatus is configured to simultaneously harvest electrical energy from the piezoelectric vibrating energy harvesting device and from the electromagnetic vibrating energy harvesting device.

3. The apparatus as claimed in claim 1, wherein the piezoelectric vibrating energy harvesting device further comprises:

a cantilever host beam having a first end attached to a fixed end structure; and
a layer of piezoelectric material attached to the cantilever host beam;
wherein the permanent magnet mass is attached to a second free end of the cantilever host beam.

4. The apparatus as claimed in claim 3, wherein the piezoelectric vibrating energy harvesting device further comprises:
a rectifier circuit connected to a first electrical output of the layer of piezoelectric material and to a second electrical output of the layer of piezoelectric material; and
a power storage unit connected to an output of the rectifier circuit and configured to receive and store electrical energy created due to vibrations of the layer of piezoelectric material.

5. The apparatus as claimed in claim 1, wherein the electromagnetic vibrating energy harvesting device comprises:
a fixed conductive winding located adjacent to the permanent magnet mass;
wherein the fixed conductive winding is configured to receive the variable magnetic flux from the permanent magnet mass when the permanent magnet mass moves.

6. The apparatus as claimed in claim 5, wherein the fixed conductive winding comprises a plurality of loops of conductive wire.

7. The apparatus as claimed in claim 5, wherein the fixed conductive winding is one of: located below the permanent magnet mass and located above the permanent magnet mass.

8. The apparatus as claimed in claim 5, wherein the electromagnetic vibrating energy harvesting device further comprises:
a rectifier circuit connected to a first electrical output of the fixed conductive winding and to a second electrical output of the fixed conductive winding; and
a power storage unit connected to an output of the rectifier circuit and configured to receive and store electrical energy created due to electromotance induced in the fixed conductive winding by relative motion of the permanent magnet mass with respect to the fixed conductive winding.

9. The apparatus as claimed in claim 1, wherein:
the piezoelectric vibrating energy harvesting device is configured to generate a high voltage and a low current;
the electromagnetic vibrating energy harvesting device is configured to generate a low voltage and a high current; and
the piezoelectric electromagnetic hybrid vibrating energy harvester is configured to generate a high voltage and a high current.

10. The apparatus as claimed in claim 1, wherein the permanent magnet mass is attached to a vibrating portion of the piezoelectric vibrating energy harvesting device.

11. The apparatus as claimed in claim 10, wherein the apparatus is configured to simultaneously harvest electrical energy from the piezoelectric vibrating energy harvesting device and from the electromagnetic vibrating energy harvesting device.

12. A method of harvesting electrical energy comprising the steps of:
harvesting electrical energy using a piezoelectric vibrating energy harvesting device that comprises a permanent magnet mass; and
simultaneously harvesting electrical energy using an electromagnetic vibrating energy harvesting device that receives a variable magnetic flux from the permanent magnet mass when the permanent magnet mass moves.

13. The method as claimed in claim 12, wherein the piezoelectric vibrating energy harvesting device comprises:
a cantilever host beam having a first end attached to a fixed end structure;
a layer of piezoelectric material attached to the cantilever host beam; and
the permanent magnet mass attached to a second free end of the cantilever host beam.

14. The method as claimed in claim 13, wherein the step of harvesting electrical energy using the piezoelectric vibrating energy harvesting device comprises:
transforming vibrational energy in the layer of piezoelectric material to electrical energy; and
storing the electrical energy.

15. The method as claimed in claim 12, wherein the step of simultaneously harvesting electrical energy using the electromagnetic vibrating energy harvesting device comprises the step of:
receiving, in a fixed conductive winding adjacent to the permanent magnet mass, the variable magnetic flux from the permanent magnet mass when the permanent magnet mass moves.

16. The method as claimed in claim 15, wherein the fixed conductive winding comprises a plurality of loops of conductive wire.

17. The method as claimed in claim 15, wherein the fixed conductive winding is one of: located below the permanent magnet mass and located above the permanent magnet mass.

18. A piezoelectric electromagnetic hybrid vibrating energy harvester comprising:
a piezoelectric vibrating energy harvesting device that comprises:
a layer of piezoelectric material attached to a cantilever host beam having a first end attached to a fixed end structure; and
a permanent magnet mass attached to a second free end of the cantilever host beam; and
an electromagnetic vibrating energy harvesting device that comprises a fixed conductive winding located adjacent to the permanent magnet mass and configured to receive a variable magnetic flux from the permanent magnet mass when the permanent magnet mass moves.

19. The piezoelectric electromagnetic hybrid vibrating energy harvester as claimed in claim 18, wherein:
the piezoelectric vibrating energy harvesting device is configured to harvest electrical energy using a piezoelectric effect; and
the electromagnetic vibrating energy harvesting device is configured to simultaneously harvest electrical energy using electromagnetic induction.

20. The piezoelectric electromagnetic hybrid vibrating energy harvester as claimed in claim 18, wherein:
the piezoelectric vibrating energy harvesting device further comprises a first rectifier circuit connected to electrical outputs of the layer of piezoelectric material;
the electromagnetic vibrating energy harvesting device further comprises a second rectifier circuit connected to electrical outputs of the fixed conductive winding; and
further comprising a power storage unit connected to outputs of the first and second rectifier circuits and configured to receive and store the electrical energy from the piezoelectric vibrating energy harvesting device and the electromagnetic vibrating energy harvesting device.

* * * * *